United States Patent [19]

Nakamura

[11] Patent Number: 5,672,888
[45] Date of Patent: Sep. 30, 1997

[54] THIN-FILM TRANSISTOR AND THIN-FILM TRANSISTOR ARRAY

[75] Inventor: Kenichi Nakamura, Minato-ku, Japan

[73] Assignee: NEC Corporation, Tokyo, Japan

[21] Appl. No.: 758,083

[22] Filed: Nov. 27, 1996

[30] Foreign Application Priority Data

Dec. 8, 1995 [JP] Japan .......................... 320506

[51] Int. Cl.$^6$ .................................. H01L 29/786
[52] U.S. Cl. ..................... 257/72; 257/66; 257/408; 359/59; 359/88
[58] Field of Search ..................... 257/57, 59, 66, 257/72, 294, 344, 408, 401; 437/193, 194; 359/59, 87, 88

[56] References Cited

U.S. PATENT DOCUMENTS

| | | | |
|---|---|---|---|
| 4,759,610 | 7/1988 | Yanagisawa | 257/59 |
| 5,308,998 | 5/1994 | Yamazaki et al. | 257/57 |

FOREIGN PATENT DOCUMENTS

| | | | |
|---|---|---|---|
| 57-88944 | 11/1980 | Japan . | |
| 1-158775 | 6/1989 | Japan | 257/57 |
| 4-360580 | 12/1992 | Japan | 257/57 |

OTHER PUBLICATIONS

English language Abstract corresponding to Japanese Unexamined Patent Publication No. 4–415, Jan. 1992.

E. Takeda et al., "An Amorphous Si TFT Array with TaOx/SiNx Double Layered Insulator For Liquid Crystal Displays", 1988 International Display Research Conference, pp. 155–158.

Primary Examiner—Jerome Jackson
Assistant Examiner—John F. Guay
Attorney, Agent, or Firm—Sughrue, Mion, Zinn, Macpeak, and Seas.

[57] ABSTRACT

An active layer is sandwiched between a first gate electrode and a second gate electrode, and an offset region is disposed in overlying and underlying relation to a third gate electrode and a fourth gate electrode, respectively, resulting in a double-gate structure that is effective to produce a large ON current and a low leakage current. Storage capacitances for suppressing a reduction in a pixel potential are formed between a transparent pixel electrode and a third storage capacitance electrode, between the third storage capacitance electrode and a second storage capacitance electrode, and between the second storage capacitance electrode and a first storage capacitance electrode. Large storage capacitances are thus formed in a small area.

5 Claims, 5 Drawing Sheets

THIN-FILM TRANSISTOR AND THIN-FILM TRANSISTOR ARRAY

BACKGROUND OF THE INVENTION

1. Field of the Invention

The present invention relates to a thin-film transistor for use in an active-matrix liquid-crystal display panel, and a thin-film transistor array comprising such thin-film transistors.

2. Description of the Related Art

As the era of multimedia has begun, there has been a growing demand for high-definition, large-size display units as an important device that plays a central role in man-machine interface. Liquid-crystal projectors have been studied and manufactured for practical applications as a device which can meet such a demand. One design goal which should be attained by present liquid-crystal projectors is a high luminance level for projected screens. To achieve such a high luminance level for projected screens, it is necessary to increase the luminance of a light source used and also to increase the aperture ratio of a liquid-crystal panel.

The aperture ratio of a liquid-crystal panel represents the proportion of an area of the liquid-crystal panel excluding wiring such as data lines and gate lines, switching transistors, and storage capacitance electrodes in an entire display area of the liquid-crystal panel. To accomplish the high luminance level for projected screens, the area occupied by the wiring, the switching transistors, and the storage capacitance electrodes has to be reduced. However, reducing the width of the wiring results in an increase in the resistance of the wiring, tending to cause signals to be delayed.

The storage capacitance is indispensable for keeping a high level of contrast. Specifically, after data have been written in pixel electrodes, the storage capacitance serves to minimize any reduction in a pixel potential due to a current leak across the switching transistors. If a leakage current is small, then the storage capacitance which is required may also be small. If a larger storage capacitance can be produced in a smaller area, then a larger aperture ratio can be attained.

The switching transistors need an ON current large enough to charge the liquid-crystal capacitance and the storage capacitance during a period for writing data. The switching transistors can be reduced in size by increasing their ability to be driven by currents.

Therefore, the high luminance level for projected screens requires that the leakage current across the switching transistors be reduced to reduce the necessary storage capacitance, the ON current be increased to reduce the size of the switching transistors, and the area of the storage capacitance electrodes be reduced.

Japanese unexamined utility model publication No. 57-88944 discloses a double-gate structure as a scheme for increasing the ON current. A thin-film transistor with such a conventional double-gate structure will be described below with reference to FIG. 1 of the accompanying drawings.

Figure 1:
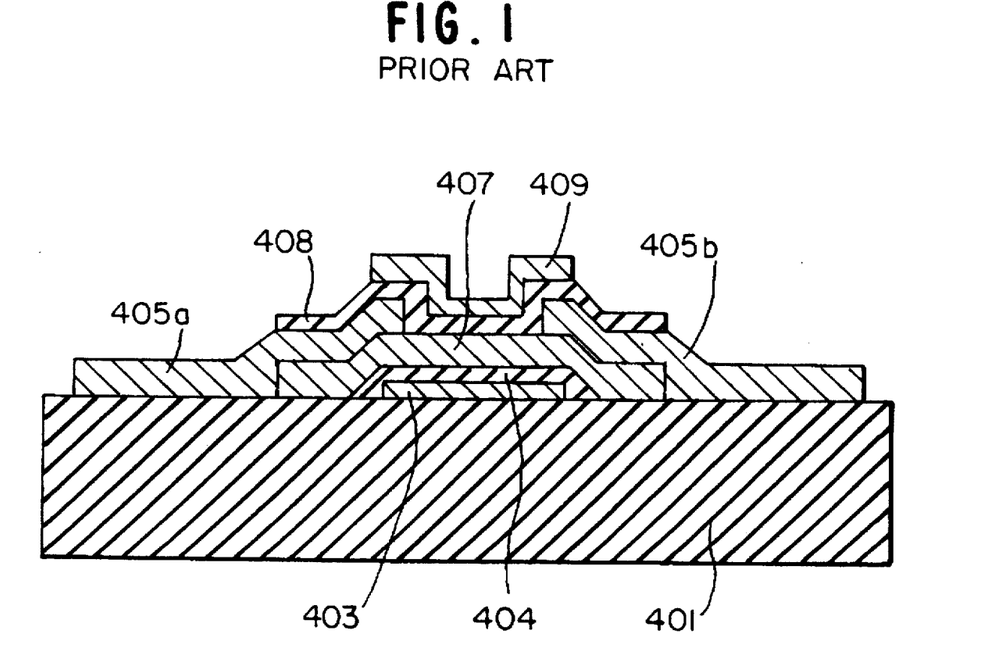
FIG. 1 is a cross-sectional view of a thin-film transistor having a conventional double-gate structure.

As shown in FIG. 1, the thin-film transistor has an insulating substrate 401, a first gate electrode 403, a first insulating film 404, a source electrode 405a, a drain electrode 405b, a semiconductor layer 407, a second gate insulating film 408, and a second gate electrode 409. The first gate electrode 403 is disposed on the insulating substrate 401, and the first insulating film 404 is disposed in covering relation to the first gate electrode 403. The semiconductor layer 407 is disposed in covering relation to the first insulating film 404. The source electrode 405a and the drain electrode 405b are disposed in partly overlapping relation to the semiconductor layer 407. The second gate insulating film 408 overlaps the semiconductor layer 407. The second gate electrode 409 is disposed on the second gate insulating film 408 in overlapping relation to the first gate electrode 403. If the thin-film transistor is used as a switching transistor for a liquid-crystal panel, then since the gate electrodes are positioned above and below the active layer of the thin-film transistor, channels are developed on both sides of the active layer, producing a high ON current. However, because the thin-film transistor is not of an offset structure, an electric field at an end of the drain electrode is not reduced, making it difficult to lower the leakage current. As a result, the thin-film transistor requires a large storage capacitance, failing to increase the aperture ratio of the liquid-crystal panel.

Figure 2A:
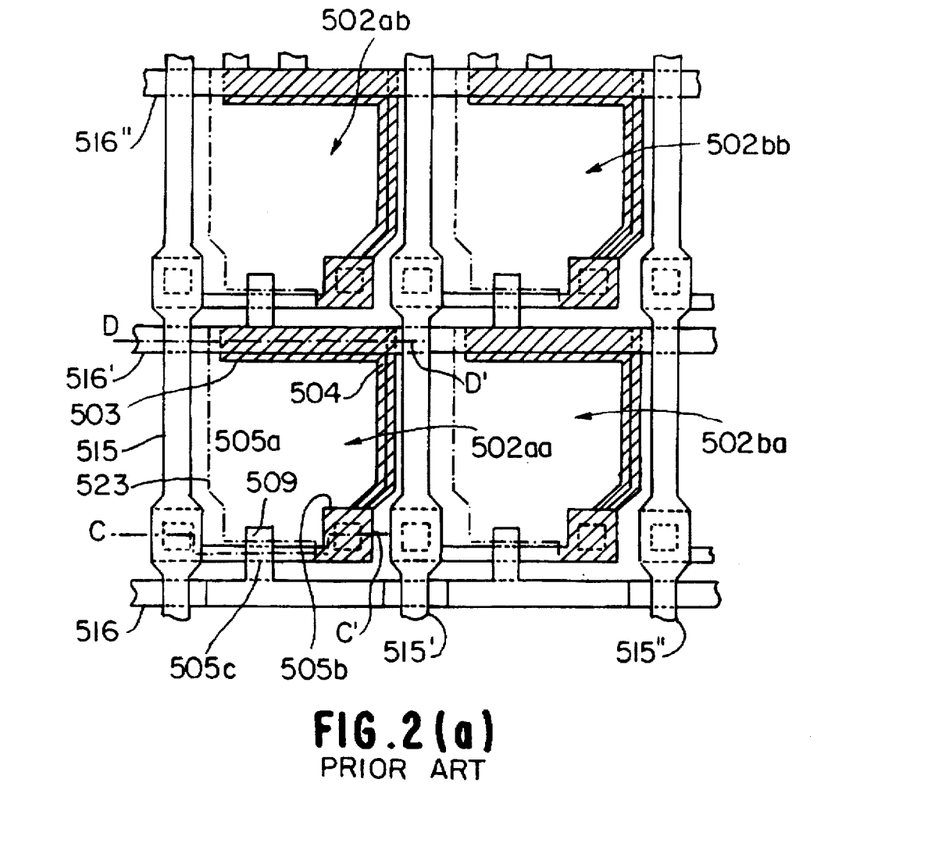
FIG. 2(a) is a fragmentary plan view of a conventional liquid-crystal display panel which has a storage capacitance formed by a stacking structure.
Figure 2B:
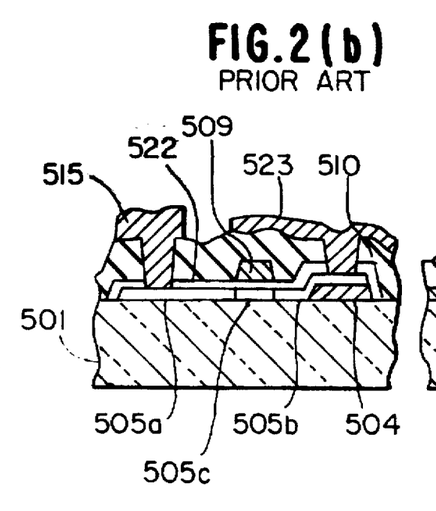
FIG. 2(b) is a cross-sectional view taken along line C–C' of FIG. 2(a)
Figure 2C:
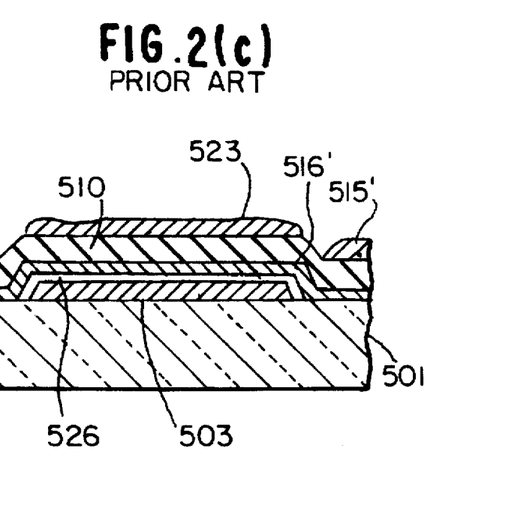
FIG. 2(c) is a cross-sectional view taken along line D–D' of FIG. 2(a)

The formation of a storage capacitance with a stacking structure to reduce the area of the storage capacitance is disclosed in Japanese unexamined patent publication No. 4-415. The storage capacitance thus formed as applied to a liquid-crystal display panel will be described below with reference to FIGS. 2(a) through 2(c) of the accompanying drawings. FIG. 2(a) is a fragmentary plan view of a conventional liquid-crystal display panel. FIGS. 2(b) and 2(c) are cross-sectional views taken along lines C–C' and D–D', respectively, of FIG. 2(a).

As shown in FIGS. 2(a) through 2(c), the liquid-crystal display panel has a glass substrate 501, pixel regions 502aa, 502ab, 502ba, 502bb, a lower electrode 503, a junction layer 504, a source 505a, a drain 505b, a channel region 505c, a gate electrode 509, an interlayer insulating film 510, data lines 515, 515', 515", gate lines 516, 516', 516", a gate oxide film 522, a transparent pixel electrode 523, and a dielectric insulating film 526.

As shown in FIG. 2(a), the data lines 515, 515', 515" and the gate lines 516, 516', 516" extend perpendicularly across each other with the pixel regions 502aa, 502ab, 502ba, 502bb, each having a size of 50 μm by 50 μm, being defined between the data lines 515, 515'515" and the gate lines 516, 516', 516". An internal structure of the liquid-crystal display panel will be described below with respect to the pixel region 502aa, for example. A thin-film transistor is composed of the gate electrode 509 extending from the gate line 516, the source 505a connected to the data line 515, and the drain 505b. The lower electrode 503 is connected to the drain 505b through the junction layer 504, and the gate line 516' is disposed in overlapping relation to the lower electrode 503. The transparent pixel electrode 523, which is made of indium tin oxide (ITO), is disposed substantially fully on the pixel region 502aa above the foregoing structure. The transparent pixel electrode 523 is connected through an opening to the drain 505b of the thin-film transistor. A region where a storage capacitance is formed below the gate line 516' is shown in cross section in FIG. 2(c). The dielectric insulating film 526 which is formed at the same time as the gate oxide film 522 is disposed above the lower electrode 503, which is of a rectangular shape and formed as a conductive polycrystalline silicon layer on the glass substrate 501. The gate line 516' is disposed on the dielectric insulating film 526 and extends in the same direction as the lower electrode 503. The transparent pixel electrode 523 has a portion present above the gate line 516' with the interlayer insulating film 510 interposed therebetween. The liquid-crystal display panel has a storage capacitance having the lower electrode 503 made of conductive polycrystalline silicon and an upper electrode. Since the gate line is used as part of a storage capacitance electrode, the storage capacitance may be relatively large without sacrificing the aperture ratio.

Since the thin-film transistor having the conventional double-gate structure fails to reduce the leakage current, it requires a large storage capacitance, and cannot increase the aperture ratio. A parasitic capacitance is formed between a light-shield layer and source and drain regions, causing problems such as a data signal delay, a waveform distortion, etc.

The conventional formation of a storage capacitance has been disadvantageous in that when pixels are reduced in size for displaying higher-definition images, the relative ratio of the area occupied by the storage capacitance electrode with respect to the pixels suffers a sharp increase, resulting in a large reduction in the aperture ratio.

SUMMARY OF THE INVENTION

It is an object of the present invention to provide a thin-film transistor with a reduced leakage current for use in an active-matrix liquid-crystal display panel, and a thin-film transistor array composed of such thin-film transistors which is capable of forming a large storage capacitance in a small area.

According to the present invention, there is provided a thin-film transistor comprising a semiconductor layer having an active layer and source and drain regions, a first gate insulating film disposed under the semiconductor layer, a first gate electrode disposed under the first gate insulating film in underlying relation to the active layer, a second gate insulating film disposed over the semiconductor layer, a second gate electrode disposed over the second gate insulating film in overlying relation to the active layer, a first interlayer insulating film disposed over the second gate insulating film, an offset region disposed between the active layer and the source and drain regions and comprising a semiconductor layer having a low impurity concentration, a third gate electrode electrically connected to the first gate electrode in overlapping relation to at least the offset region, the third gate electrode being disposed out of overlapping relation to the source and drain regions, and a fourth gate electrode electrically connected to the second gate electrode in overlapping relation to at least the offset region, the fourth gate electrode being disposed out of overlapping relation to the source and drain regions; wherein the first gate insulating film has a portion which is disposed between the semiconductor layer and the first gate electrode and has a film thickness d1, and the first gate insulating film has a portion which is disposed between the semiconductor layer and the third gate electrode and has a film thickness d3, the film thicknesses d1, d3 satisfying the relationship: d3>d1, and the second gate insulating film has a portion which is disposed between the semiconductor layer and the second gate electrode and has a film thickness d2, and the second gate insulating film and the first interlayer insulating film have portions which are disposed between the semiconductor layer and the fourth gate electrode and have a film thickness d4, the film thicknesses d2, d4 satisfying the relationship: d4>d2.

Each of the first gate electrode and the second gate electrode may be made of polycrystalline silicon containing a high concentration of an impurity, and each of the third gate electrode and the fourth gate electrode may be made of a metal.

The thin-film transistor has a double-gate structure with the gate electrodes disposed above and below the active layer, and can produce a large ON current even if it is reduced in size. Because the thin-film transistor is of an offset structure, an electric field at an end of a drain electrode is reduced, making it possible to lower the leakage current. Light is blocked by the gate electrodes against being applied to the offset region, thereby preventing an increase in the leakage current which would occur if light were applied to the offset region. Since the third and fourth gate electrodes are held out of underlying and overlying relation to the source and drain regions, it is possible to reduce a parasitic capacitance between the gate electrode and the source and drain regions and hence to suppress a propagation delay and a waveform distortion of a data signal.

According to the present invention, there is also provided a thin-film transistor array for use in a pixel area of an active-matrix liquid-crystal display panel which can be energized through independent perpendicular data lines and gate lines, having a thin-film transistor described above, at points of intersection between a plurality of the data lines and a plurality of the gate lines which extend perpendicularly to the data lines, the data lines being electrically connected to the source region of the semiconductor layer, the gate lines being electrically connected to the first gate electrode and the second gate electrode, the drain region of the semiconductor layer being electrically connected to a pixel electrode.

The thin-film transistor array further comprises a second storage capacitance electrode disposed on the same plane as the semiconductor layer, a second interlayer insulating film disposed on the fourth gate electrode, the pixel electrode being disposed on the second interlayer insulating film and electrically connected to the drain region, a first storage capacitance electrode disposed on the same plane as the first gate electrode or the third gate electrode in underlying relation to the second storage capacitance electrode with the first gate insulating film interposed therebetween, and a third storage capacitance electrode disposed on the same plane as the second gate electrode or the fourth gate electrode in overlying relation to the second storage capacitance electrode with at least the second gate insulating film interposed therebetween; wherein the pixel electrode is disposed in overlying relation to a portion of the second storage capacitance electrode with the second interlayer insulating film interposed therebetween, and electrically connected to the second storage capacitance electrode, and the first storage capacitance electrode and the third storage capacitance electrode is electrically connected to each other.

At least one of the first storage capacitance electrode and the third storage capacitance electrode may be electrically connected to at least one of the first gate electrode and the second gate electrode.

Each of the storage capacitance electrodes is held at the same potential as the gate electrode in a previous stage, producing a storage capacitance between the pixel electrode and the gate electrode in the previous stage. Therefore, the effect of a change in the pixel potential is minimized which is caused by a feedthrough produced when the gate pulse drops after data are written into a switching transistor which comprises a thin-film transistor in the previous stage. Because no electrode lines for keeping the individual storage capacitance electrodes at the same potential are required, the entire circuit of the thin-film transistor is not made complex, and the aperture ratio is not sacrificed.

The storage capacitances are formed by a structure in which portions of the storage capacitance electrodes are sandwiched between the gate electrodes in two layers. This allows an effective area in which the storage capacitance electrodes are formed to be increased. A portion of the overlying pixel electrode is effective to increase the storage capacitances. Therefore, it is possible to produce large storage capacitances in a small area.

Consequently, the thin-film transistor can be reduced in size and the area of the storage capacitance electrodes can be reduced without lowering the quality of images displayed by an active-matrix liquid-crystal display panel which incorporates the thin-film transistor. Therefore, the aperture ratio of a liquid-crystal projector as such an active-matrix liquid-crystal display panel can be increased for a high luminance level.

The above and other objects, features, and advantages of the present invention will become apparent from the following description with reference to the accompanying drawings which illustrate examples of the present invention.

BRIEF DESCRIPTION OF THE DRAWINGS

FIG. 4(a) is a cross-sectional view taken along line A–A' of FIG. 4(a);

DETAILED DESCRIPTION OF THE PREFERRED EMBODIMENTS

An n-channel thin-film transistor according to a first embodiment of the present invention will be described below with reference to FIG. 3.

Figure 3:
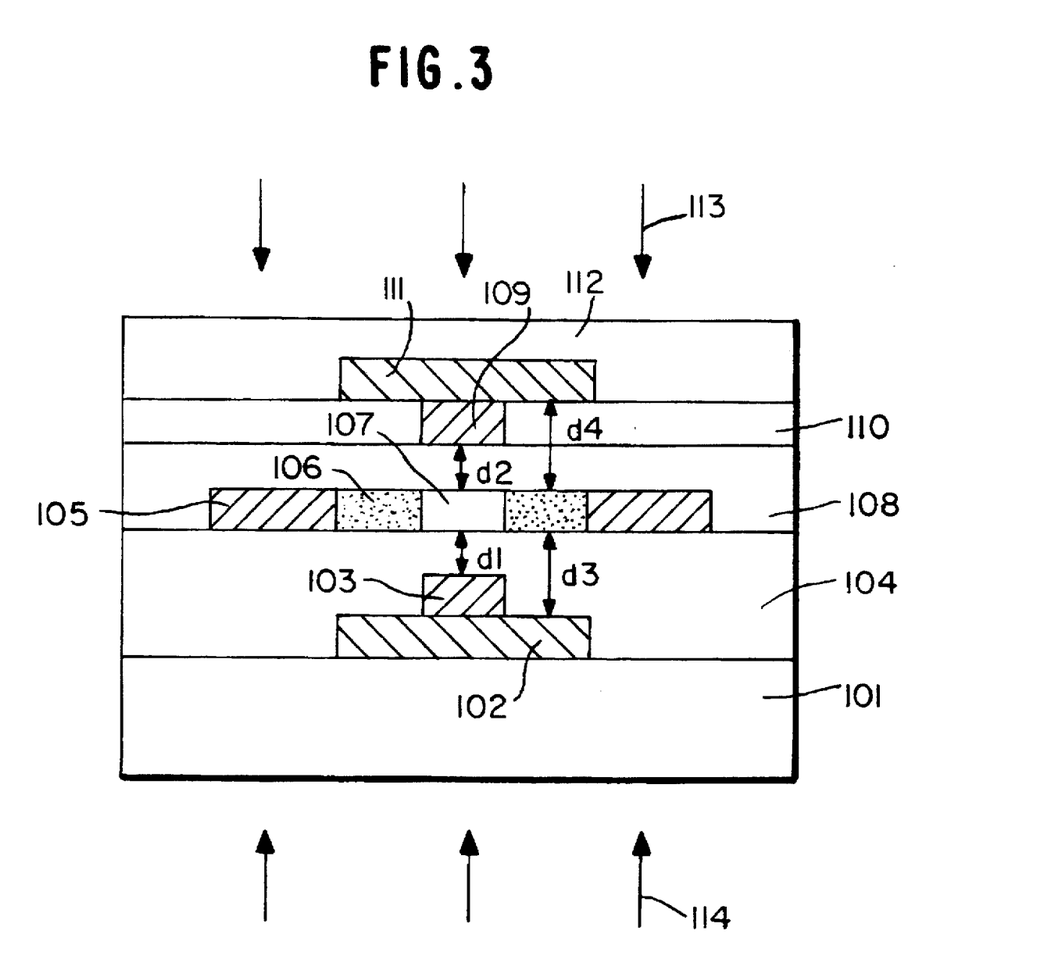
FIG. 3 is a cross-sectional view of an n-channel thin-film transistor according to a first embodiment of the present invention.

As shown in FIG. 3, the n-channel thin-film transistor has a glass substrate 101, a third gate electrode 102, a first gate electrode 103, a first gate insulating film 104, source and drain regions 105, an offset region 106, an active layer 107, a second gate insulating film 108, a second gate electrode 109, a first interlayer insulating film 110, a fourth gate electrode 111, and a second interlayer insulating film 112. Light 113 emitted from a light source is applied to the n-channel thin-film transistor, and light 114 reflected from an optical system is also applied to the n-channel thin-film transistor.

The third gate electrode 102, which is made of aluminum, is disposed on the glass substrate 101. The first gate electrode 103, which comprises a poly-Si film containing about $1 \times 10^{20}$ cm$^{-3}$ of phosphor, is disposed on the third gate electrode 102. The first gate insulating film 104, which comprises an SiO$_2$ film, is disposed on the glass substrate 101 in covering relation to the first gate electrode 103 and the third gate electrode 102. The source and drain regions 105, which comprise a poly-Si film containing about $1 \times 10^{20}$ cm$^{-3}$ of phosphorus, the offset region 106, which comprises a poly-Si film containing about $1 \times 10^{17}$ cm$^{-3}$ of phosphor, and the active layer 107, which comprises a poly-Si film containing almost no impurities, are disposed on the first gate insulating film 104.

The portion of the first gate insulating film 104 which lies on the first gate electrode 103 has a film thickness d1, and the portion of the first gate insulating film 104 which lies on the third gate electrode 102 has a film thickness d3. These film thicknesses d1, d3 satisfy the relationship: d3>d1. Such a structure can easily be produced by planarizing the first gate insulating film 104 according to a bias etching process or the like.

The first gate electrode 103 underlies the active layer 107, and the third gate electrode 102 underlies the active layer 107 and the offset region 106. The second gate insulating film 108, which comprises an SiO$_2$ film, is disposed covering relation to the source and drain regions 105, the offset region 106, and the active layer 107.

The second gate electrode 109, which comprises a poly-Si film containing about $1 \times 10^{20}$ cm$^{-3}$ of phosphor, is disposed on a portion of the second gate insulating film 108. The first interlayer insulating film 110 is disposed on the other portion of the second gate insulating film 108 which is free of the second gate electrode 109. The fourth gate electrode 111, which is made of aluminum, is disposed on the second gate electrode 109.

If the portion of the second gate insulating film 108 underneath the second gate electrode 109 has a film thickness d2 and the portions of the second gate insulating film 108 and the first interlayer insulating film 110 below the fourth gate electrode 111 have a film thickness d4, then these film thicknesses d2, d4 satisfy the relationship: d4>d2.

The second gate electrode 109 overlies the active layer 107, and the fourth gate electrode 111 overlies the active layer 107 and the offset region 106. The second interlayer insulating film 112, which comprises an SiO$_2$ film, is disposed on the first interlayer insulating film 110 in covering relation to the fourth gate electrode 111. The light 113 emitted from the light source is blocked by the fourth gate electrode 111 and hence is not applied to the offset region 106 and the active layer 107, and the light 114 reflected from the optical system is blocked by the third gate electrode 102 and hence is not applied to the offset region 106 and the active layer 107. The first gate electrode 103 and the second gate electrode 109 are electrically connected to each other. Channels are formed respectively on both surfaces of the active layer 107.

Figure 4A:
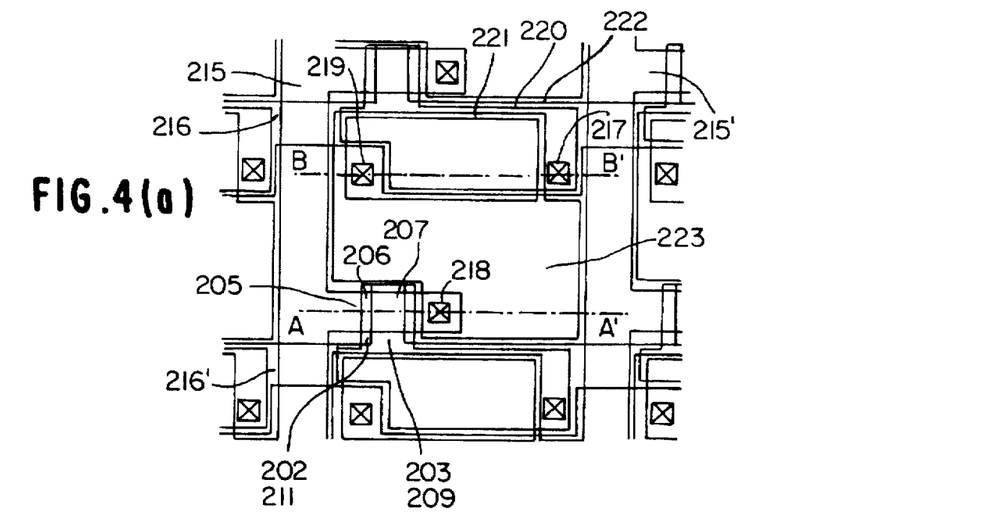
FIG. 4(a) is a fragmentary plan view of a switching array of a pixel area in a liquid-crystal projector which incorporates a thin-film transistor according to a second embodiment of the present invention.
Figure 4B:
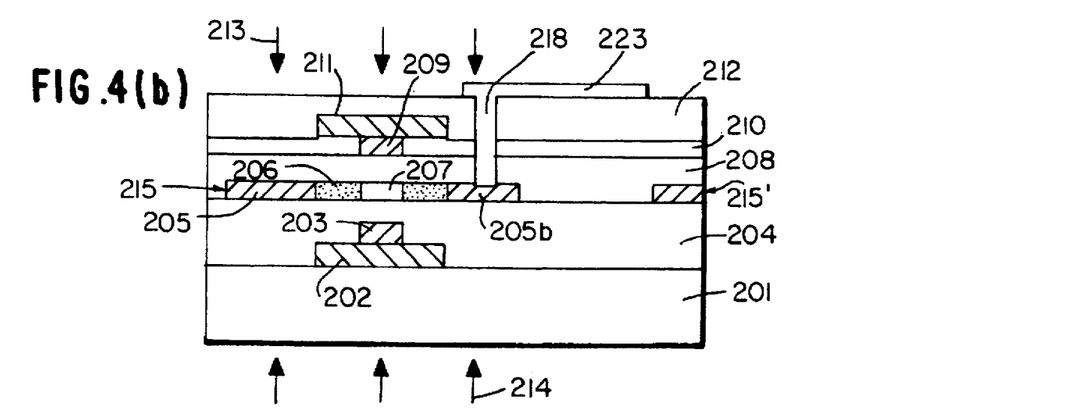
Figure 4C:
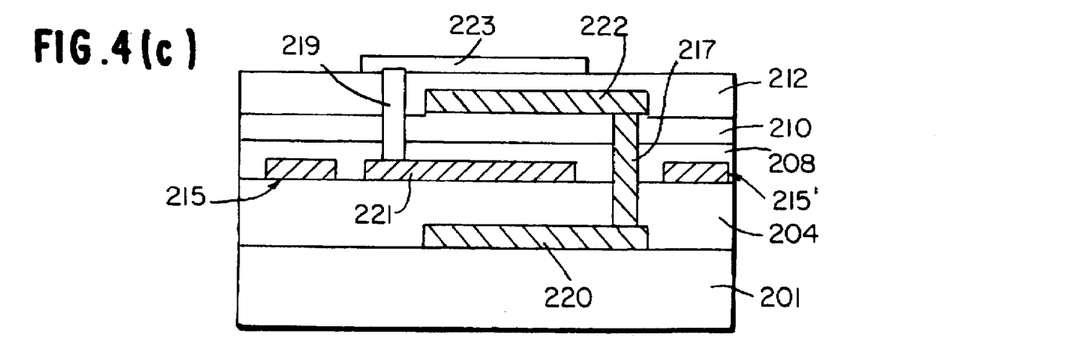
FIG. 4(c) is a cross-sectional view taken along line B–B' of FIG. 4(a)

A thin-film transistor according to a second embodiment of the present invention as incorporated in a liquid-crystal projector is shown in FIGS. 4(a), 4(b), and 4(c). The thin-film transistor has a glass substrate 201, a third gate electrode 202, a first gate electrode 203, a first gate insulating film 204, source and drain regions 205, a drain electrode 205b, an offset region 206, an active layer 207, a second gate insulating film 208, a second gate electrode 209, a first interlayer insulating film 210, a fourth gate electrode 211, a second interlayer insulating film 212, data lines 215, 215', gate lines 216, 216', a first contact hole 217, a second contact hole 218, a third contact hole 219, a first storage capacitance electrode 220, a second storage capacitance electrode 221, a third storage capacitance electrode 222, and a transparent pixel electrode 223. Light 213 emitted from a light source is applied to the thin-film transistor, and light 214 reflected from an optical system is also applied to the thin-film transistor.

As shown in FIG. 4(a), a region surrounded by the data lines 215, 215' and the gate lines 216, 216' serves as a unit pixel. As shown in FIGS. 4(b) and 4(c), the third gate electrode 202, which is made of aluminum, and the first storage capacitance electrode 220 which is made of aluminum, are disposed on the glass substrate 201. The first gate electrode 203, which comprises a poly-Si film containing about $1 \times 10^{20}$ cm$^{-3}$ of phosphor, is disposed on the third gate electrode 202. The first gate insulating film 204, which comprises an SiO$_2$ film, is disposed on the glass substrate 201 in covering relation to the first gate electrode 203, the third gate electrode 202, and the first storage capacitance electrode 220. The source and drain regions 205, which comprise a poly-Si film containing about $1 \times 10^{20}$ cm$^{-3}$ of phosphor, the offset region 206, which comprises a poly-Si film containing about $1 \times 10^{17}$ cm$^{-3}$ of phosphor, and the active layer 207, which comprises a poly-Si film containing almost no impurities, are disposed on the first gate insulating film 204. The second storage capacitance electrode 221, which contains about $1 \times 10^{20}$ cm$^{-3}$ of phosphor, is disposed on the first gate insulating film 204 in overlapping relation to the first storage capacitance electrode 220. The first gate electrode 203 underlies the active layer 207, and the third gate electrode 202 underlies the offset region.206.

The second gate insulating film 208, which comprises an SiO$_2$ film, is disposed in covering relation to the source and drain regions 205, the offset region 206, and the active layer 207 and the second storage capacitance electrode 221. The second gate electrode 209, which comprises a poly-Si film containing about $1 \times 10^{20}$ cm$^{-3}$ of phosphor, is disposed on a portion of the second gate insulating film 208. The first interlayer insulating film 210, which comprises an SiO$_2$ film, is disposed on the other portion of the second gate insulating film 208 which is free of the second gate electrode 209. The fourth gate electrode 211, which is made of aluminum, is disposed on the second gate electrode 209. The third storage capacitance electrode 222, which is made of aluminum, is disposed on the first interlayer insulating film 210 in overlapping relation to the first storage capacitance electrode 220 and a portion of the second storage capacitance electrode 221. The third storage capacitance electrode 222 is electrically connected to the first storage capacitance electrode 220 through the first contact hole 217. The second interlayer insulating film 212, which comprises an SiO$_2$ film, is disposed in covering relation to the third storage capacitance electrode 222 and the fourth gate electrode 211. The transparent pixel electrode 223, which is made of indium tin oxide (ITO), is disposed on the second interlayer insulating film 212, and electrically connected to the drain electrode 205b through the second contact hole 218 and to the second storage capacitance electrode 221 through the third contact hole 219.

As shown in FIG. 4(a), the first storage capacitance electrode 220 and the third gate electrode 202 are formed on the same plane without being separated from each other, and the third storage capacitance electrode 222 and the fourth gate electrode 211 are formed on the same plane without being separated from each other. With these electrodes being electrically connected to each other, since no electrode is required to keep the individual storage capacitance electrodes at a constant potential, a high aperture ratio can be maintained. Gate pulses of switching the thin-film transistor array are applied successively through the gate lines 216, 216' in the order named. Therefore, an instantaneous change in the pixel potential which is caused by a feedthrough produced when the gate pulse on the gate line 216 falls has almost no effect on the pixel potential because the pixel potential is rewritten immediately after the instantaneous change.

The light 213 emitted from the light source is applied to the active layer 207 from the direction where the second gate electrode 209 is disposed, and the light 214 reflected from the optical system is applied to the active layer 207 from the direction where the first gate electrode 203 is disposed. Storage capacitances for suppressing a reduction in the pixel potential are forced between the transparent pixel electrode 223 and the third storage capacitance electrode 222, between the third storage capacitance electrode 222 and the second storage capacitance electrode 221, and between the second storage capacitance electrode 221 and the first storage capacitance electrode 220.

According to the present invention, as described above, the first and second gate electrodes 203, 209 which are disposed respective below and above the active layer 207 provide a double-gate structure that is effective to produce a large ON current even if the switching transistor is reduced in size. Because the thin-film transistor is of an offset structure, an electric field at an end of the drain electrode is reduced, making it possible to lower the leakage current.

As shown in FIG. 3, the light 113 emitted from the light source is blocked by the fourth gate electrode 111 and hence is not applied to the offset region 106, and the light 114 reflected from the optical system is blocked by the third gate electrode 102 and hence is not applied to the offset region 106. As a consequence, an increase in the leakage current which would occur if light were applied to the offset region 106 is prevented from taking place, and a reduction in the contrast which would be caused by a reduction in the pixel potential is suppressed.

Figure 5:
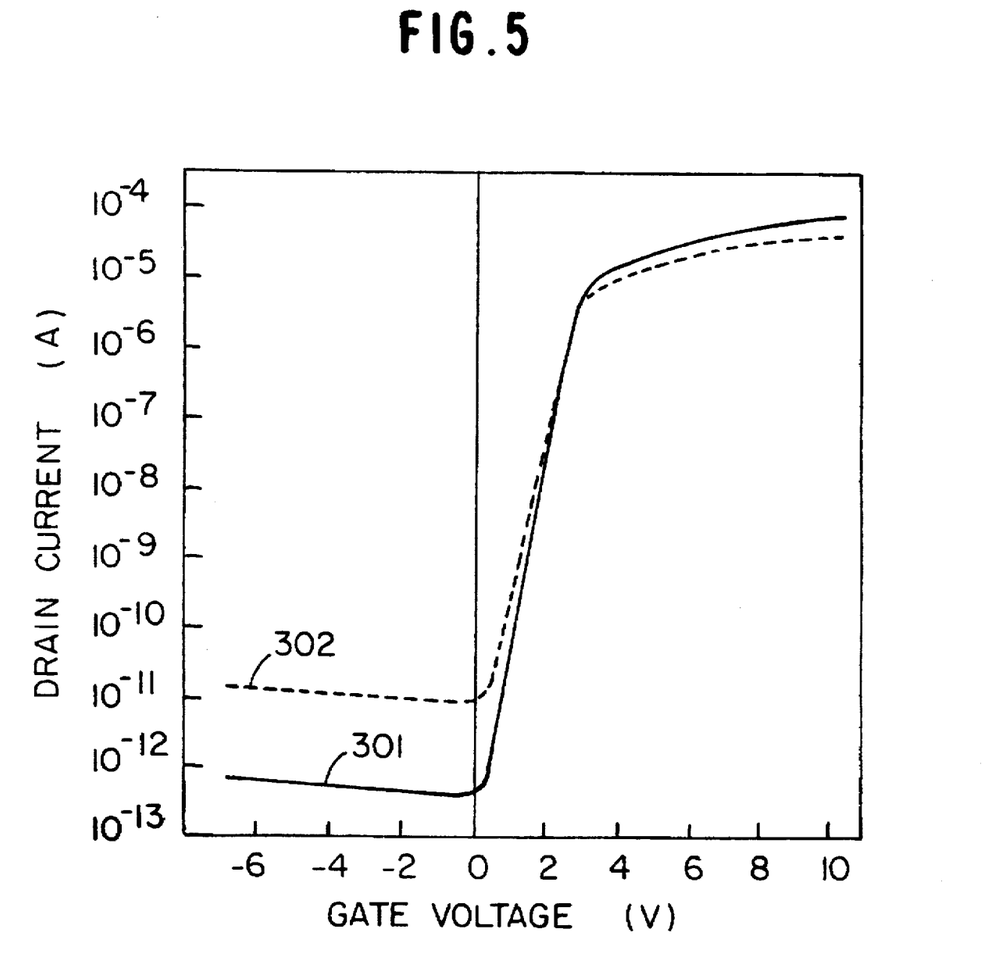
FIG. 5 is a graph showing, for comparison, how a drain current depends upon a gate voltage in the thin-film transistor according to the present invention and a conventional thin-film transistor.

A specific example of such a property is shown in FIG. 5. FIG. 5 shows how a drain current depended upon a gate voltage in the thin-film transistor according to the present invention and a conventional thin-film transistor when the thin-film transistors were irradiated by a metal halide lamp of 250 W. In FIG. 5, the curve 301 represents the dependency of the drain current on the gate voltage in the thin-film transistor according to the present invention, and the curve 302 represents the dependency of the drain current on the gate voltage in the conventional thin-film transistor. Each of the thin-film transistors had a gate width of 5 µm, a gate length of 3 µm, and an offset length of 1µm. The conventional thin-film transistor had a single-gate structure. When the pixel was in a holding state with a gate voltage of −2 V and a drain voltage of 10 V, the drain current of the conventional thin-film transistor was $1 \times 10^{-11}$ A, but the drain current of the thin-film transistor according to the present invention was reduced to $5 \times 10^{-13}$ A, which was 1/20 of the drain current of the conventional thin-film transistor. When the pixel was in an ON state with a gate voltage of 10 V and a drain voltage of 10 V, the drain current of the conventional thin-film transistor was $5 \times 10^{-5}$ A, but the drain current of the thin-film transistor according to the present invention was $1 \times 10^{-4}$ A, which was twice the drain current of the conventional thin-film transistor, allowing the size of the switching transistor to be reduced to a half. Inasmuch as the third gate electrode 102 and the fourth gate electrode 111 do not overlap the source and drain regions 105, a parasitic capacitance between the gate electrode and the source and drain regions can be reduced, so that a propagation delay and a waveform distortion of a data signal can be suppressed.

In the second embodiment, the first storage capacitance electrode 220 is disposed on the same plane as the third gate electrode 202, the second storage capacitance electrode 221 is disposed on the same plane as the source and drain regions 205, the third storage capacitance electrode 222 is disposed on the same plane as the fourth gate electrode 211, and the transparent pixel electrode 223 is disposed on the second interlayer insulating film 212. With this arrangement, large storage capacitances can be formed in a small area without sacrificing the aperture ratio. It is therefore possible to fabricate a liquid-crystal projector which is capable of achieving both a high luminance level and a high contrast. According to the present invention, the aperture ratio which has heretofore been 50% is increased up to 70%, and, as a result, the luminance is increased by 40% from a conventional level.

It is to be understood that although the characteristics and advantages of the present invention have been set forth in the foregoing description, the disclosure is illustrative only, and changes may be made in the arrangement of the parts within the scope of the appended claims.

What is claimed is:

1. A thin-film transistor comprising:

a semiconductor layer having an active layer and source and drain regions;

a first gate insulating film disposed under said semiconductor layer;

a first gate electrode disposed under said first gate insulating film in underlying relation to said active layer;

a second gate insulating film disposed over said semiconductor layer;

a second gate electrode disposed over said second gate insulating film in overlying relation to said active layer;

a first interlayer insulating film disposed over said second gate insulating film;

an offset region disposed between said active layer and said source and drain regions and comprising a semiconductor layer having a low impurity concentration;

a third gate electrode electrically connected to said first gate electrode in overlapping relation to at least said offset region, said third gate electrode being disposed out of overlapping relation to said source and, drain regions; and a fourth gate electrode electrically connected to said second gate electrode in overlapping relation to at least said offset region, said fourth gate electrode being disposed out of overlapping relation to said source and drain regions;

wherein said first gate insulating film has a portion which is disposed between said semiconductor layer and said first gate electrode and has a film thickness d1, and said first gate insulating film has a portion which is disposed between said semiconductor layer and said third gate electrode and has a film thickness d3, said film thicknesses d1, d3 satisfying the relationship: d3>d1; and said second gate insulating film has a portion which is disposed between said semiconductor layer and said second gate electrode and has a film thickness d2, and said second gate insulating film and said first interlayer insulating film have portions which are disposed between said semiconductor layer and said fourth gate electrode and have a film thickness d4, said film thicknesses d2, d4 satisfying the relationship: d4>d2.

2. A thin-film transistor according to claim 1, wherein each of said first gate electrode and said second gate electrode is made of polycrystalline silicon containing a high concentration of an impurity, and each of said third gate electrode and said fourth gate electrode is made of a metal.

3. A thin-film transistor array for use in a pixel area of an active-matrix liquid-crystal display panel which can be energized through independent perpendicular data lines and gate lines, having a thin-film transistor according to claim 1, at points of intersection between a plurality of said data lines and a plurality of said gate lines which extend perpendicularly to said data lines, said data lines being electrically connected to the source region of said semiconductor layer, said gate lines being electrically connected to said first gate electrode and said second gate electrode, said drain region of said semiconductor layer being electrically connected to a pixel electrode.

4. A thin-film transistor array according to claim 3, further comprising:

a second storage capacitance electrode disposed on the same plane as said semiconductor layer;

a second interlayer insulating film disposed on said fourth gate electrode;

said pixel electrode being disposed on said second interlayer insulating film and electrically connected to said drain region;

a first storage capacitance electrode disposed on the same plane as said first gate electrode or said third gate electrode in underlying relation to said second storage capacitance electrode with said first gate insulating film interposed therebetween; and a third storage capacitance electrode disposed on the same plane as said second gate electrode or said fourth gate electrode in overlying relation to said second storage capacitance electrode with at least said second gate insulating film interposed therebetween;

wherein said pixel electrode is disposed in overlying relation to a portion of said second storage capacitance electrode with said second interlayer insulating film interposed therebetween, and electrically connected to said second storage capacitance electrode; and said first storage capacitance electrode and said third storage capacitance electrode is electrically connected to each other.

5. A thin-film transistor array according to claim 4, wherein at least one of said first storage capacitance electrode and said third storage capacitance electrode is electrically connected to at least one of said first gate electrode and said second gate electrode.

* * * * *

UNITED STATES PATENT AND TRADEMARK OFFICE
CERTIFICATE OF CORRECTION

PATENT NO.   : 5,672,888
DATED        : September 30, 1997
INVENTOR(S)  : Kenichi NAKAMURA It is certified that error(s) appears in the above-identified patent and that said Letters Patent is hereby corrected as shown below:

Item No. [30], Foreign Application Priority Data, change "320506" to --7-320506--.

Signed and Sealed this

Tenth Day of March, 1998

Attest:

BRUCE LEHMAN

*Attesting Officer*   *Commissioner of Patents and Trademarks*